(12) United States Patent
Shigeno et al.

(10) Patent No.: US 8,773,851 B2
(45) Date of Patent: Jul. 8, 2014

(54) POWER CONVERTING APPARATUS

(75) Inventors: Tomohiro Shigeno, Fukuoka (JP); Toshiaki Fujiki, Fukuoka (JP); Kazutaka Kishimoto, Fukuoka (JP)

(73) Assignee: Kabushiki Kaisha Yaskawa Denki, Kitakyushu-Shi (JP)

( * ) Notice: Subject to any disclaimer, the term of this patent is extended or adjusted under 35 U.S.C. 154(b) by 198 days.

(21) Appl. No.: 13/365,260

(22) Filed: Feb. 3, 2012

(65) Prior Publication Data

US 2012/0250255 A1  Oct. 4, 2012

(30) Foreign Application Priority Data

Mar. 30, 2011  (JP) ................. 2011-075170

(51) Int. Cl.
H05K 7/20  (2006.01)

(52) U.S. Cl.
CPC ................. H05K 7/20918 (2013.01)
USPC .......... 361/690; 361/678; 361/703; 361/704; 361/709; 165/185

(58) Field of Classification Search
USPC .............. 361/679.48, 679.51, 695, 676, 678, 361/690, 703, 704, 709; 336/61, 55, 59, 60, 336/62; 363/141; 165/185
See application file for complete search history.

(56) References Cited

U.S. PATENT DOCUMENTS

| | | | | | |
|---|---|---|---|---|---|
| 3,956,673 | A | * | 5/1976 | Seid | ................. 361/690 |
| 5,676,198 | A | * | 10/1997 | Schneider et al. | ........... 165/80.3 |
| 5,915,463 | A | * | 6/1999 | Romero et al. | ............... 165/80.3 |
| 5,950,714 | A | * | 9/1999 | Schneider et al. | ........... 165/80.3 |
| 8,120,907 | B2 | * | 2/2012 | Chen et al. | ..................... 361/690 |
| 2010/0212877 | A1 | * | 8/2010 | Chen et al. | ..................... 165/185 |
| 2012/0250254 | A1 | * | 10/2012 | Kojyo et al. | .................. 361/692 |

FOREIGN PATENT DOCUMENTS

| | | |
|---|---|---|
| JP | 06-315265 | 11/1994 |
| JP | 10-150284 | 6/1998 |
| JP | 2002-112557 | 4/2002 |
| JP | 2004-180424 | 6/2004 |
| JP | 2004-186702 | 7/2004 |
| JP | 2009-094260 | 4/2009 |

OTHER PUBLICATIONS

Japanese Office Action for corresponding JP Application No. 2011-075170, Apr. 25, 2013.

* cited by examiner

*Primary Examiner* — Robert J Hoffberg
(74) *Attorney, Agent, or Firm* — Ditthavong Mori & Steiner, P.C.

(57) ABSTRACT

A power converting apparatus includes a housing base, a main body, an air duct, a pair of upright air duct walls, first and second heat generators, and a protrusion. The housing base has first and second surfaces. The main body is on the first surface. The air duct is for cooling air to flow through the air duct and is on the second surface. The upright air duct walls are on the second surface and extend from an upwind side to a downwind side. The first and second heat generators are disposed in series from the upwind side to the downwind side in the air duct. The protrusion is between the first and second heat generators to protrude from at least one of the pair of air duct walls toward a center portion of an air-flowing space for the cooling air.

19 Claims, 15 Drawing Sheets

Flow of cooling air

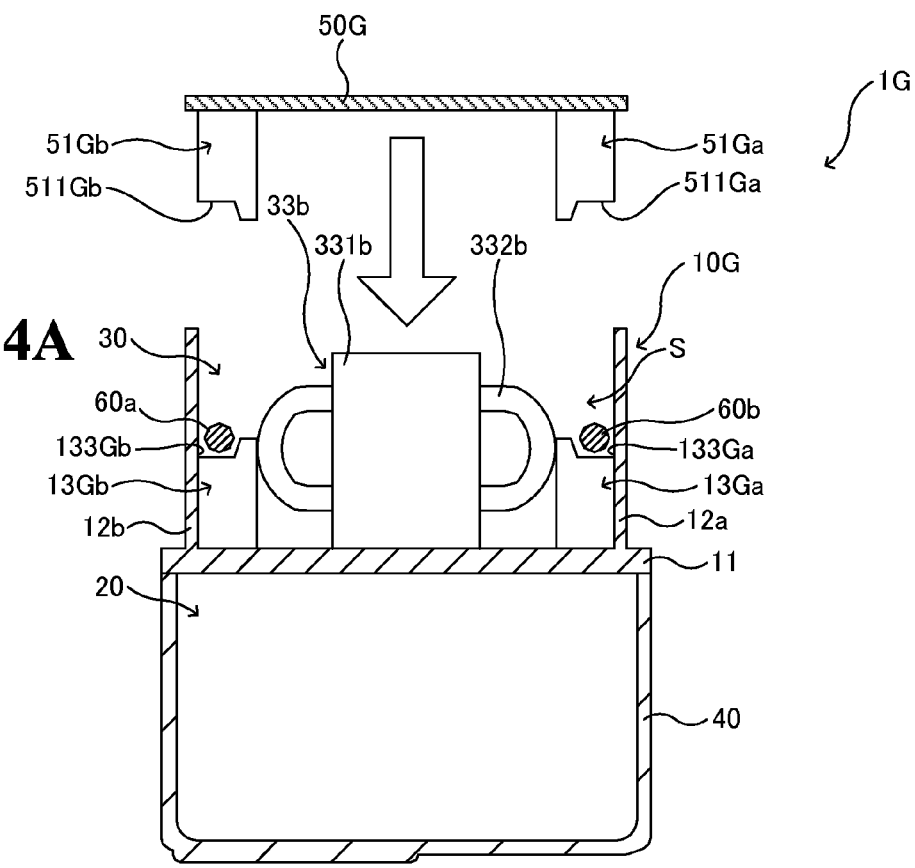
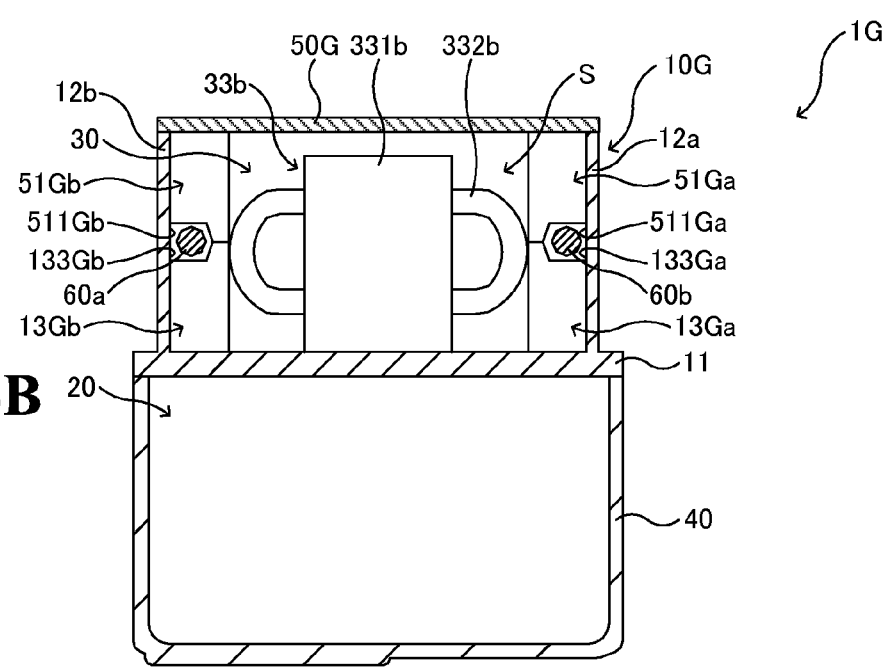

POWER CONVERTING APPARATUS

CROSS-REFERENCE TO RELATED APPLICATIONS

The present application claims priority under 35 U.S.C. §119 to Japanese Patent Application No. 2011-075170, filed Mar. 30, 2011. The contents of this application are incorporated herein by reference in their entirety.

BACKGROUND OF THE INVENTION

1. Field of the Invention

The present invention relates to a power converting apparatus.

2. Discussion of the Background

Power converters generally include a plurality of heat generators in air ducts, and the heat generators are cooled with cooling air. In applications where the plurality of heat generators are arranged in series in the upwind-downwind direction, the cooling air increases in temperature through heat exchange with the upwind heat generators and flows as such to the downwind heat generators. This results in a difference in the amount of heat radiation between the upwind and downwind heat generators.

In view of this, Japanese Unexamined Patent Application Publication No. 2004-186702 discloses a power converting apparatus including an air duct with a decremental cooling-air flow channel in the upwind-downwind direction. Specifically, the power converting apparatus includes a plurality of heat generators (heat radiating fins) arranged in series in the air duct. The cooling-air flow channel (serving a passage of air) in the air duct is decremental in the upwind-downwind direction. This increases the flow rate of the cooling air, and allegedly improves the cooling efficiency of the downwind heat generators and allegedly uniformizes the amount of heat radiation between the upwind and downwind heat generators.

SUMMARY OF THE INVENTION

According to one aspect of the present invention, a power converting apparatus is configured to convert alternating current power into direct current power or convert direct current power into alternating current power. The power converting apparatus includes a housing base, a main body, an air duct, a pair of upright air duct walls, a first heat generator and a second heat generator, and at least one protrusion. The housing base has a first surface and a second surface. The main body is on the first surface of the housing base. The air duct is on the second surface of the housing base for cooling air to flow through the air duct. The pair of upright air duct walls are on the second surface of the housing base, and extend in a direction from an upwind side to a downwind side. The first heat generator and the second heat generator are disposed in series in the direction from the upwind side to the downwind side in the air duct with the first heat generator on the upwind side and the second heat generator on the downwind side. The at least one protrusion is on at least one of the pair of air duct walls and between the first heat generator and the second heat generator to protrude toward a center portion of an air-flowing space for the cooling air.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIGS. 14A and 14B are cross-sectional views of the power converting apparatus according to a modification in which protrusions are disposed on both the housing side and the side of the air duct cover.

DESCRIPTION OF THE EMBODIMENTS

Figure 1:
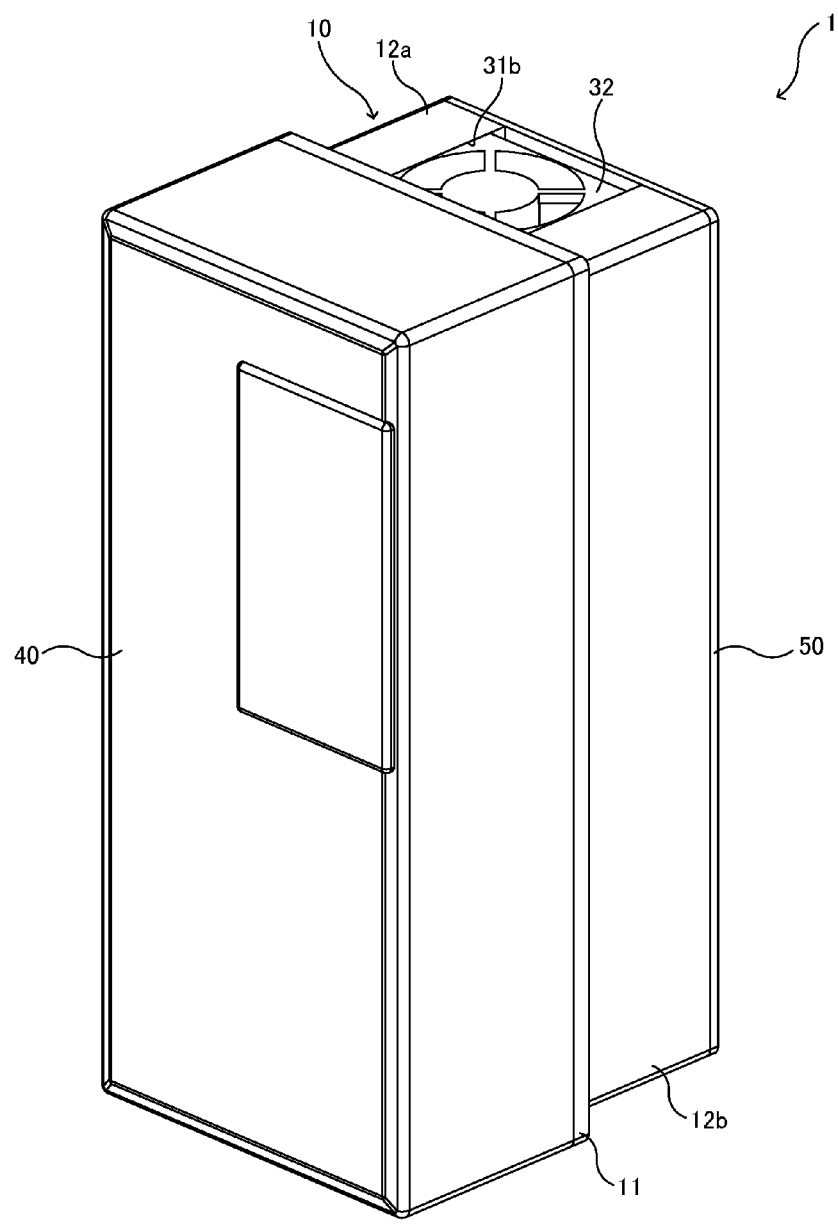
FIG. 1 is a perspective view of a power converting apparatus on the case side according to one embodiment.

The embodiments will now be described with reference to the accompanying drawings, wherein like reference numerals designate corresponding or identical elements throughout the various drawings.

As shown in FIGS. 1 to 5, a power converting apparatus 1 according to this embodiment is an inverter to convert direct current power into alternating current power. The power converting apparatus 1 includes a housing 10, a main body 20, an air duct 30, a case 40, and an air duct cover 50. The main body 20 has a plurality of electric components, not shown (examples including, but not limited to, diode modules, electromagnetic contactors, main capacitors, and power modules). The air duct 30 is for cooling air to flow through the air duct 30. The case 40 covers the main body 20. The air duct cover 50 is made of resin and is plate-shaped.

The housing 10 includes a plate-shaped housing base 11, two air duct walls 12a and 12b, and two plate-shaped protrusions 13a and 13b. The housing base 11, the air duct walls 12a and 12b, and the protrusions 13a and 13b are integrally molded by die casting of a metal material (examples including, but not limited to, aluminum alloy, zinc alloy, and magnesium alloy). As used herein, the term die casting refers to a mold casting method by which molten metal is pressed into a mold to make molded articles in large quantities with high dimensional accuracy in short time. The term die casting also refers to products resulting from the mold casting method. The protrusions 13a and 13b may be separate entities, while the housing base 11 and the air duct walls 12a and 12b may be integrally molded. Alternatively, the air duct walls 12a and 12b may be separate entities, while the housing base 11 and the protrusions 13a and 13b may be integrally molded. Alternatively, the housing base 11 may be a separate entity, while the air duct walls 12a and 12b and the protrusions 13a and 13b may be integrally molded. Alternatively, all of the housing base 11, the air duct walls 12a and 12b, and the protrusions 13a and 13b may be separate entities.

On one surface of the housing base 11 (the front-left side in FIG. 1, the rear side of the paper surface of FIG. 2 to FIG. 4, and the lower side in FIG. 5), the main body 20 is disposed. On the other surface of the housing base 11 (the rear-right side in FIG. 1, the front side of the paper surface of FIG. 2 to FIG. 4, and the upper side in FIG. 5), the air duct 30 is disposed.

Figure 2:
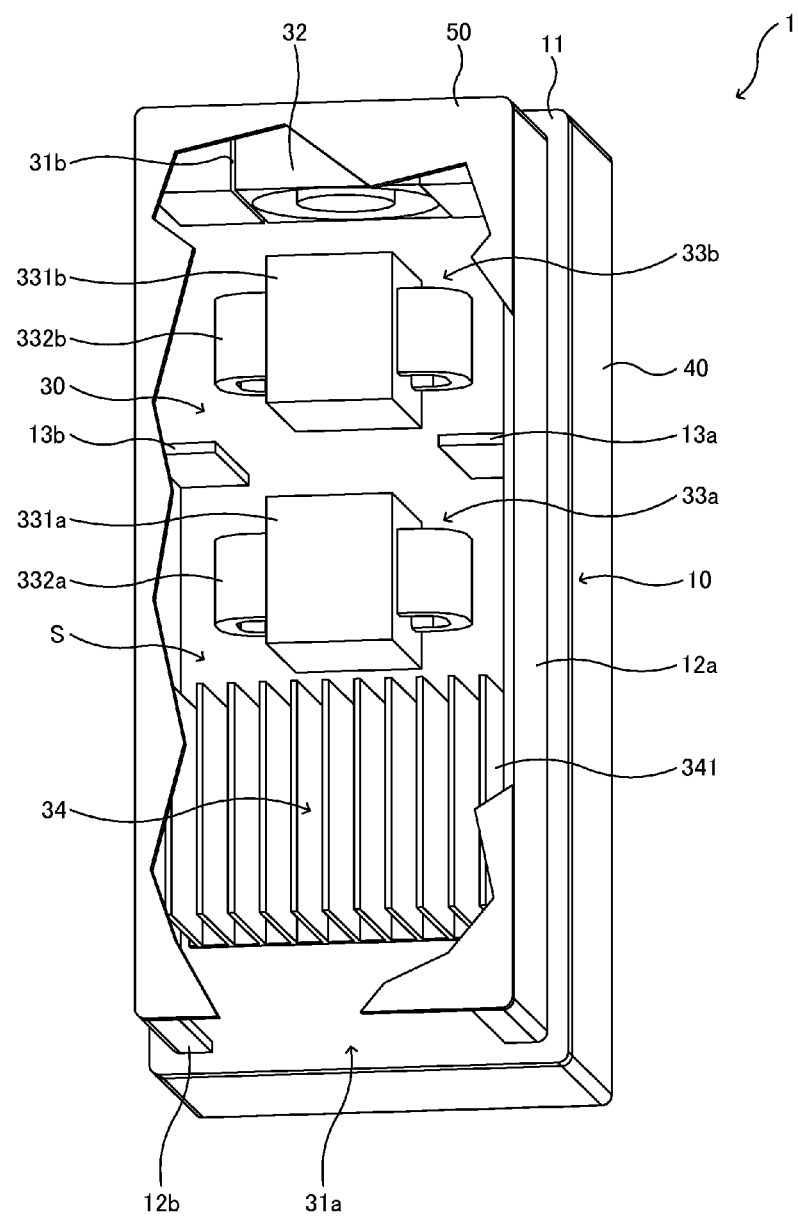
FIG. 2 is a perspective view of the power converting apparatus on the air duct side with a partially cut away air duct cover.
Figure 3:
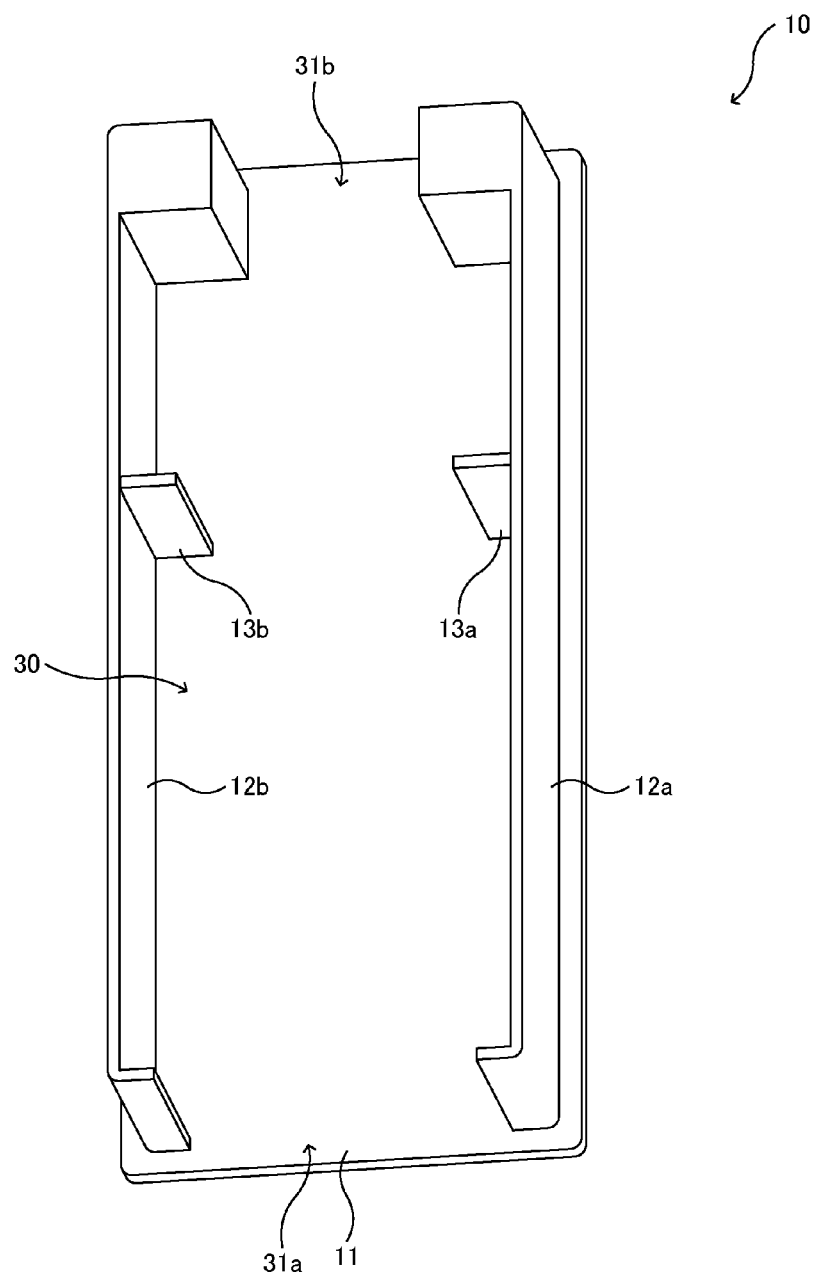
FIG. 3 is a perspective view showing the entire structure of a housing.
Figure 4:
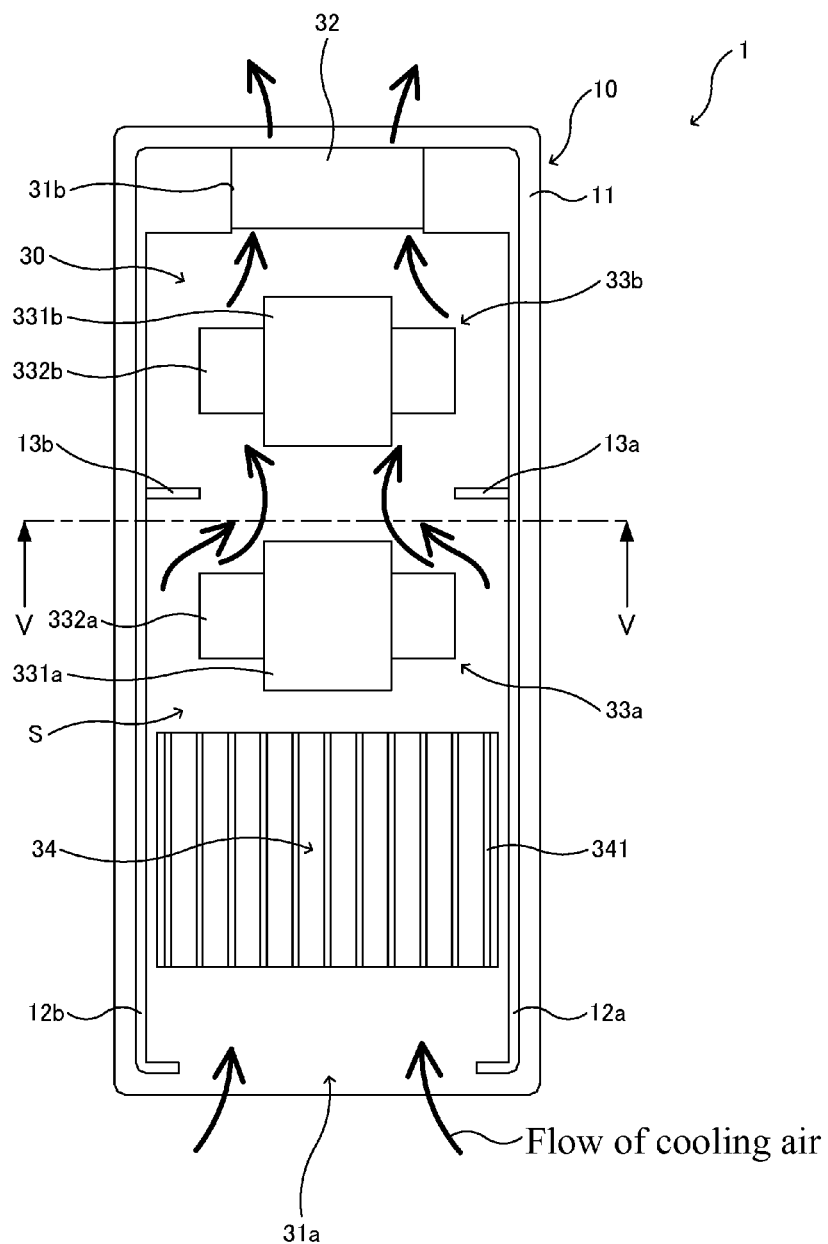
FIG. 4 is a plan view of the power converting apparatus on the air duct side with the air duct cover omitted.
Figure 5:
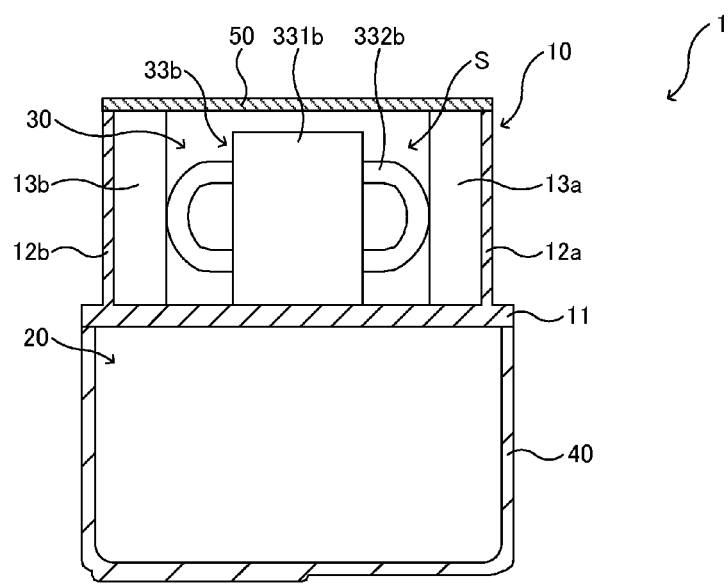
FIG. 5 is a cross-sectional view of the power converting apparatus taken along the line V-V of FIG. 4.

The air duct 30 has openings 31a and 31b respectively at one end (the lower end in FIG. 2 to FIG. 4) and the other end (the upper end in FIG. 2 to FIG. 4). Among the openings 31a and 31b, the opening 31b at the other end has a fan 32 to take in cooling air through the opening 31a and to discharge the cooling air through the opening 31b. That is, the opening 31a side of the air duct 30 (the lower side in FIG. 2 to FIG. 4 and the front side of the paper surface of FIG. 5) corresponds to the upwind side, while the opening 31b side of the air duct 30 (the upper side in FIG. 2 to FIG. 4 and the rear side of the paper surface of FIG. 5) corresponds to the downwind side. The opening 31a side of the air duct 30 will be hereinafter occasionally referred to as the upwind side, while the opening 31b side of the air duct 30 will be occasionally referred to as the downwind side. When the fan 32 rotates, cooling air is invited through the opening 31a into the air duct 30 from the upwind side to the downwind side, and is discharged through the opening 31b.

The air duct 30 includes a plurality of reactors 33a and 33b (two, first reactor 33a and second reactor 33b, in this embodiment) to smooth current pulsation of direct current power converted from alternating current power. The first and second reactors 33a and 33b are disposed in series in the direction from the upwind side to the downwind side while ensuring a predetermined insulation gap relative to each other and ensuring a predetermined insulation gap relative to the housing 10 (the air duct walls 12a and 12b and the protrusions 13a and 13b). Among the first and second reactors 33a and 33b, the first reactor 33a (first heat generator, heat generator) is on the upwind side and includes a core 331a and a coil 332a wound around the core 331a. The second reactor 33b (second heat generator, heat generator) is on the downwind side and includes a core 331b and a coil 332b wound around the core 331b. The first and second reactors 33a and 33b are arranged in the air duct 30 such that the coils 332a and 332b each have an axial direction oriented in the direction from the upwind side to the downwind side (the vertical direction in FIG. 2 to FIG. 4, and the front-to-rear direction of the paper surface of FIG. 5). In the air duct 30, cables (omitted in the drawings) are wired to the reactors 33a and 33b and other elements.

The air duct 30 also includes a plurality of fins 341 of a heat sink 34 made of highly heat conductive material (examples including, but not limited to, aluminum alloy). The heat sink 34 is disposed at a position corresponding to heat generating components (examples including, but not limited to, diode modules and power modules) contained in the electric components disposed in the main body 20. The heat sink 34 has the plurality of fins 341 radiate heat generated from the heat generating components, thus cooling the heat generating components.

The air duct walls 12a and 12b are upright on the air duct 30 side of the housing base 11 at one edge and the other edge of the air duct 30 in a direction approximately orthogonal to the direction from the upwind side to the downwind side, and extend in the direction from the upwind side to the downwind side. The one edge of the air duct 30 corresponds to the rear-left side edge in FIG. 1 and to the right side edge in FIG. 2 to FIG. 5. The other edge of the air duct 30 corresponds to the front-right side edge in FIG. 1 and to the left side edge in FIG. 2 to FIG. 5. The direction approximately orthogonal to the direction from the upwind side to the downwind side corresponds to the front-right-to-rear-left direction in FIG. 1 and to the right-to-left direction in FIG. 2 to FIG. 5. Thus, the air duct walls 12a and 12b form the side walls of the air duct 30. The air duct cover 50 is disposed on the air duct walls 12a and 12b on the side opposite the housing base 11 (the rear-right side in FIG. 1, the front side of the paper surface of FIG. 2 to FIG. 4, and the upper side in FIG. 5). The air duct cover 50 covers the air duct 30 opposite the housing base 11.

As described above, the protrusions 13a and 13b are integrally molded with the housing base 11 and the air duct walls 12a and 12b by die casting. The protrusions 13a and 13b are disposed in opposing arrangement between the adjacent first reactor 33a and second reactor 33b. Specifically, the protrusion 13a protrudes from the inner wall of the air duct wall 12a toward the center portion of an air-flowing space S, while the protrusion 13b protrudes from the inner wall of the air duct wall 12b toward the center portion of the air-flowing space S. Each of the protrusions 13a and 13b protrudes by a distance approximately corresponding to the distance between the outer peripheral position of the coil 332b of the second reactor 33b and the air duct wall 12a or 12b.

In the power converting apparatus 1 thus configured, when the fan 32 rotates, cooling air is invited through the opening 31a. The invited cooling air passes through the plurality of fins 341 and the first reactor 33a on the upwind side in the air duct 30, thereby cooling the plurality of fins 341 and the first reactor 33a. The cooling air past the first reactor 33a increases its flow rate due to the diminished flow channel at the protrusions 13a and 13b, and flows toward the outer periphery of the coil 332b of the second reactor 33b on the downwind side in the air duct 30, thereby cooling the second reactor 33b (mainly cooling the coil 332b). The cooling air past the second reactor 33b is discharged through the opening 31b.

In the power converting apparatus 1 according to this embodiment, the two reactors 33a and 33b are arranged in series in the direction from the upwind side to the downwind side in the air duct 30. The reactors 33a and 33b are cooled by cooling air. In applications, including this embodiment, where a plurality of reactors are arranged in series in the direction from the upwind side to the downwind side in the air duct, the cooling air increases in temperature through heat exchange with the upwind reactors and flows as such to the downwind reactors. A common occurrence is that a difference arises in the amount of heat radiation between the upwind and downwind reactors.

In view of this, a possible configuration to address the common occurrence is a decremental flow channel for the cooling air in the air duct in the direction from the upwind side to the downwind side. This increases the flow rate of the cooling air, and allegedly improves the cooling efficiency of the downwind reactors and allegedly uniformizes the amount of heat radiation between the upwind and downwind reactors. Unfortunately, the decremental flow channel in the air duct in the direction from the upwind side to the downwind side can restrict the size of the reactors available on the downwind side, with the result that the reactors on the downwind side may not have the same size with that of the reactors on the upwind side. Additionally, arranging the reactors in the air duct requires ensuring a predetermined insulation gap between the reactors and the housing. With the decremental configuration, however, the reactors on the downwind side are close to the housing, and therefore, the required insulation may not be ensured depending on the size of the downwind reactors. Thus, the decremental flow channel in the air duct significantly restricts the reactors available on the downwind side, resulting in a significantly degraded freedom of design of the air duct.

In contrast, in the power converting apparatus 1 according to this embodiment, the protrusions 13a and 13b protrude between the first reactor 33a on the upwind side and the second reactor 33b on the downwind side of the air duct 30. The protrusions 13a and 13b respectively protrude from the air duct walls 12a and 12b toward the center portion of the air-flowing space S. The protrusions 13a and 13b function as narrowing members to temporarily diminish the flow channel for the cooling air between the first reactor 33a and the second reactor 33b. The narrowing members increase the flow rate of the cooling air toward the second reactor 33b on the downwind side, thereby improving the cooling efficiency of the second reactor 33b on the downwind side and uniformizing the amount of heat radiation between the upwind reactor 33a and the downwind reactor 33b. Meanwhile, arranging the protrusions 13a and 13b between the first reactor 33a and the second reactor 33b makes the area of the flow channel in the air duct 30 unchanged between the area of the first reactor 33a on the upwind side and the area of the second reactor 33b on the downwind side. This makes the conditions for arranging the reactors 33 coherent throughout the upwind side and the downwind side. This results in a significantly improved freedom of design of the air duct 30 while uniformizing the amount of heat radiation between the upwind reactor 33a and the downwind reactor 33b.

It is particularly noted that in this embodiment, the protrusions 13a and 13b are disposed on the housing 10. This ensures integral molding of the protrusions 13a and 13b with the housing base 11 and the air duct walls 12a and 12b by die casting. Disposing the protrusions 13a and 13b on the housing 10 also makes them function as ribs for the housing 10 to increase the strength of the housing 10. Furthermore, the heat generated at the reactors 33a and 33b is partially radiated through the housing base 11 and the air duct walls 12a and 12b. In this respect, disposing the protrusions 13a and 13b on the housing 10 makes the protrusions 13a and 13b function as fins for the housing 10 to increase the heat radiation efficiency.

It is particularly noted that in this embodiment, the reactors 33a and 33b are disposed in the air duct 30 such that the coils 332a and 332b each have an axial direction oriented in the direction from the upwind side to the downwind side. This ensures uniform application of cooling air to the cores 331a and 331b and the coils 332a and 332b, thereby efficiently cooling the reactors 33a and 33b.

It is particularly noted that in this embodiment, the protrusions 13a and 13b respectively protrude from the air duct walls 12a and 12b toward the center portion of the air-flowing space S by a distance approximately corresponding to the distance between the outer peripheral position of the coil 332b of the second reactor 33b and the air duct wall 12a or 12b. This increases the flow rate of the cooling air toward the outer periphery of the coil 332b of the second reactor 33b on the downwind side. This leads to cooling of mainly the coil 332b, thereby improving the cooling efficiency of the second reactor 33b on the downwind side.

This embodiment should not be construed in a limiting sense. Numerous modifications and variations are possible in light of the above teachings. A number of modifications will be described below.

(1) A Single Protrusion in the Housing

While in the above embodiment the housing 10 has two protrusions 13a and 13b, this should not be construed in a limiting sense. For example, the housing 10 may have a single protrusion 13.

Figure 6:
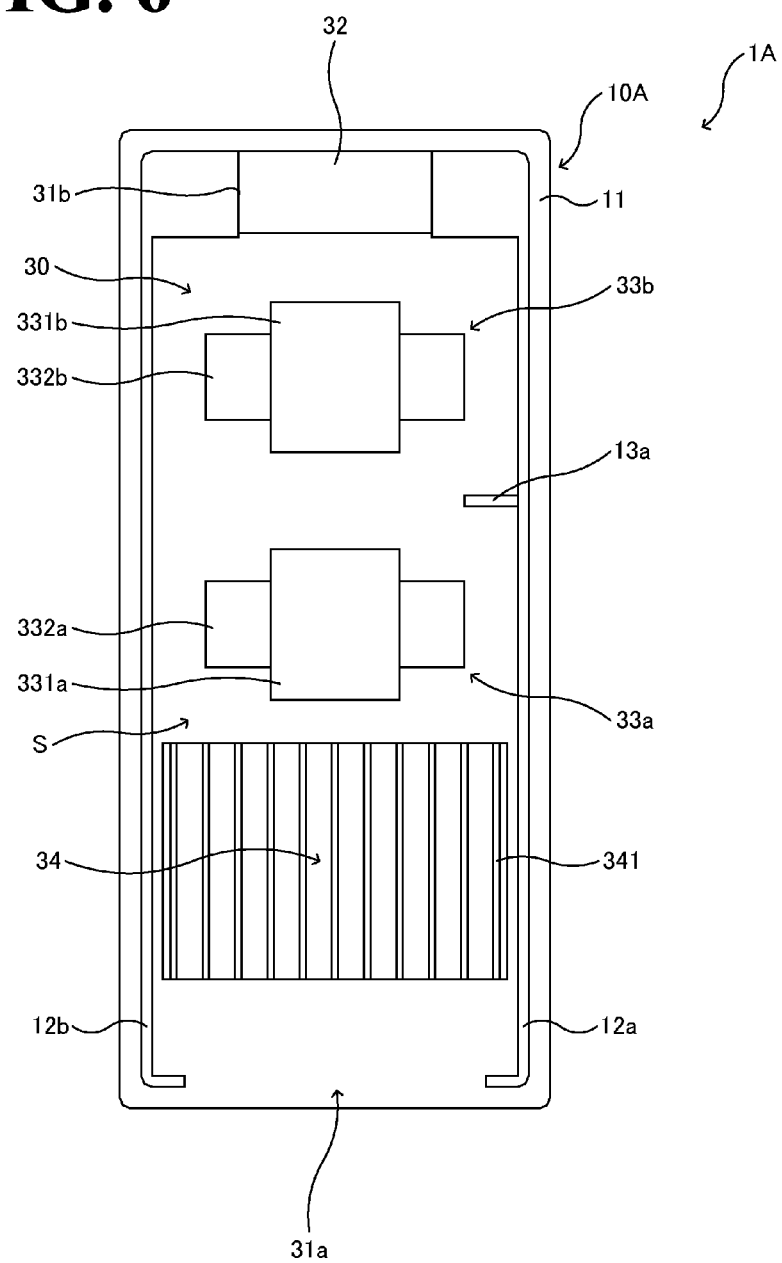
FIG. 6 is a plan view of the power converting apparatus on the air duct side with the air duct cover omitted according to a modification in which the housing includes a single protrusion.

Referring to FIG. 6, which illustrates a power converting apparatus 1A according to this modification, a housing 10A includes the housing base 11, the air duct walls 12a and 12b, and the protrusion 13a, all of which are as described above. That is, the housing 10A corresponds to the housing 10 less the protrusion 13b. The power converting apparatus 1A is otherwise similar to the power converting apparatus 1 according to the above embodiment. This modification provides similar advantageous effects to those in the above embodiment.

Alternatively, the housing may include the housing base 11, the air duct walls 12a and 12b, and the protrusion 13b (corresponding to the housing 10 less the protrusion 13a). This also provides similar advantageous effects to those in the above embodiment.

(2) The Protrusions Protrude by a Distance Corresponding to the Distance between the Inner Peripheral Surface of the Coil and the Air Duct Wall In the above embodiment, the protrusions 13a and 13b respectively protrude from the air duct walls 12a and 12b toward the center portion of the air-flowing space S by a distance approximately corresponding to the distance between the outer peripheral position of the coil 332b of the second reactor 33b and the air duct wall 12a or 12b. This, however, should not be construed in a limiting sense. That is, the protrusions 13a and 13b may protrude from the air duct walls 12a and 12b toward the center portion of the air-flowing space S by a distance approximately corresponding to the distance between the inner peripheral position of the coil 332b of the second reactor 33b and the air duct wall 12a or 12b.

Figure 7:
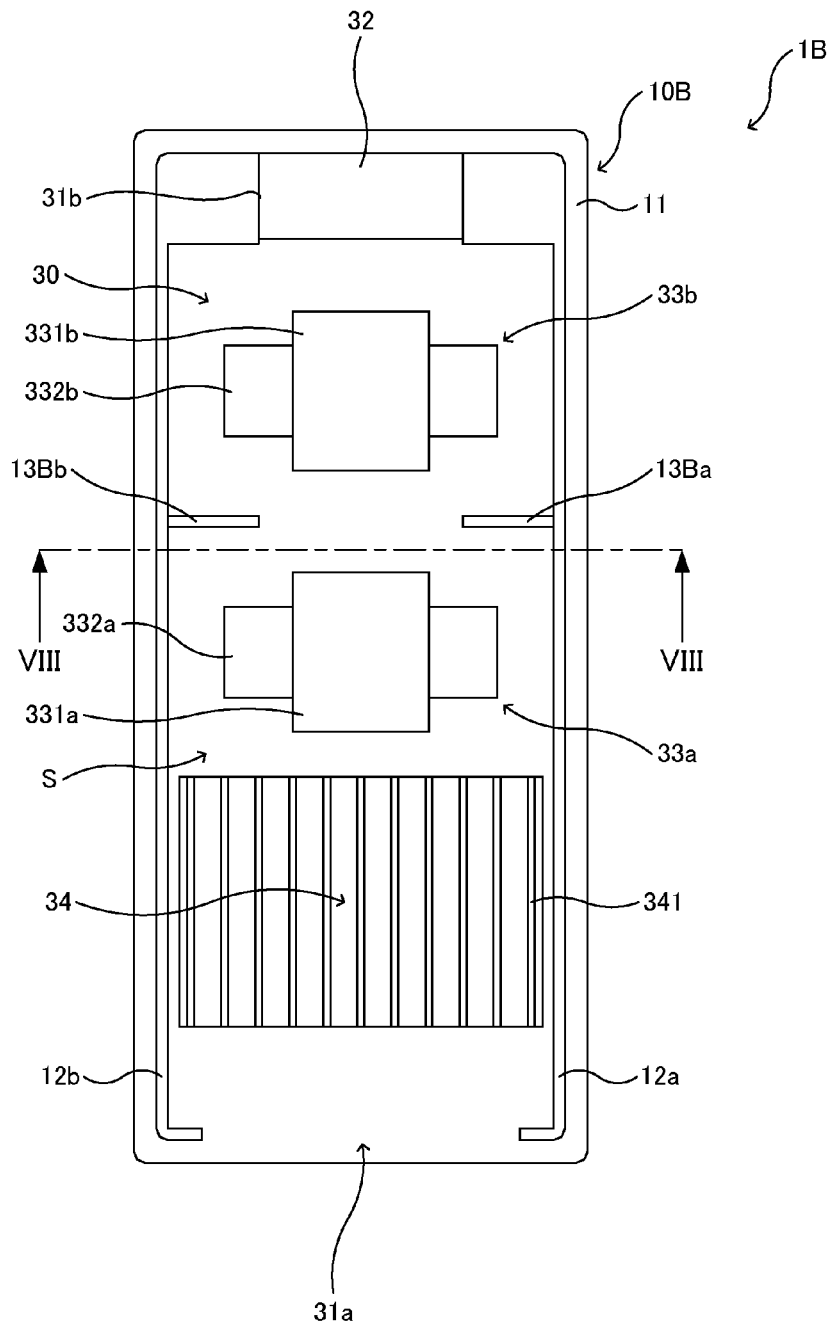
FIG. 7 is a plan view of the power converting apparatus on the air duct side with the air duct cover omitted according to a modification in which protrusions protrude by a distance corresponding to the distance between an inner peripheral surface of a coil and an air duct wall.
Figure 8:
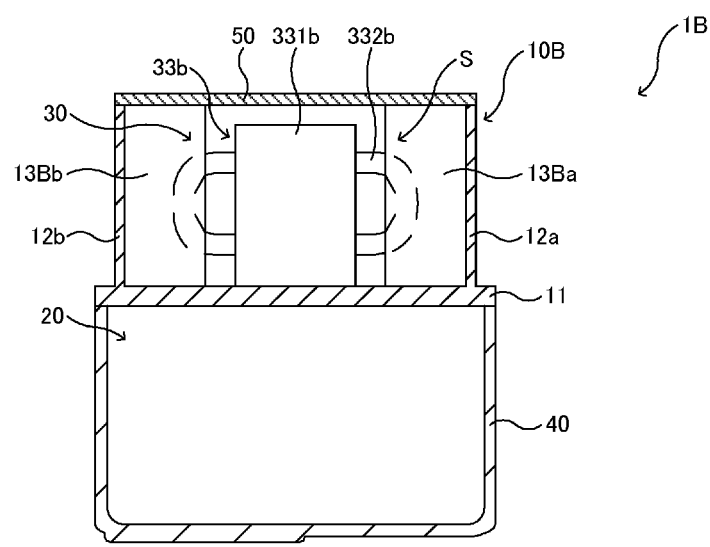
FIG. 8 is a cross-sectional view of the power converting apparatus taken along the line VIII-VIII of FIG. 7.

Referring to FIG. 7 and FIG. 8, which illustrate a power converting apparatus 1B according to this modification, a housing 10B includes the above-described housing base 11, the above-described air duct walls 12a and 12b, and two plate-shaped protrusions 13Ba and 13Bb.

Similarly to the above-described protrusions 13a and 13b, the protrusions 13Ba and 13Bb are molded integrally with the housing base 11 and the air duct walls 12a and 12b. The protrusions 13Ba and 13Bb are disposed in opposing arrangement between the first reactor 33a and second reactor 33b. Specifically, the protrusion 13Ba protrudes from the inner wall of the air duct wall 12a toward the center portion of the air-flowing space S. The protrusion 13Bb protrudes from the inner wall of the air duct wall 12b toward the center portion of the air-flowing space S. The protrusions 13Ba and 13Bb protrudes by a distance approximately corresponding to the distance between the inner peripheral position of the coil 332b of the second reactor 33b and the air duct wall 12a or 12b.

The power converting apparatus 1B is otherwise similar to the power converting apparatus 1 according to the above embodiment.

In the power converting apparatus 1B thus configured, the cooling air past the first reactor 33a increases its flow rate due to the diminished flow channel at the protrusions 13Ba and 13Bb, flows toward the inner periphery of the coil 332b of the second reactor 33b (toward the gap between the core 331b and the coil 332b) on the downwind side in the air duct 30, thereby cooling the second reactor 33b (mainly the core 331b). The cooling air past the second reactor 33b is discharged through the opening 31b.

With this modification, the protrusions 13Ba and 13Bb respectively protrude from the air duct walls 12a and 12b toward the center portion of the air-flowing space S by a distance approximately corresponding to the distance between the inner peripheral position of the coil 332b of the second reactor 33b and the air duct wall 12a or 12b. This increases the flow rate of the cooling air toward the inner periphery of the coil 332b of the second reactor 33b (toward the gap between the core 331b and the coil 332b) on the downwind side. This leads to cooling of mainly the core 331b, thereby improving the cooling efficiency of the second reactor 33b on the downwind side.

(3) First Example of Upwind Tapered Surfaces on the Protrusions

Figure 9:
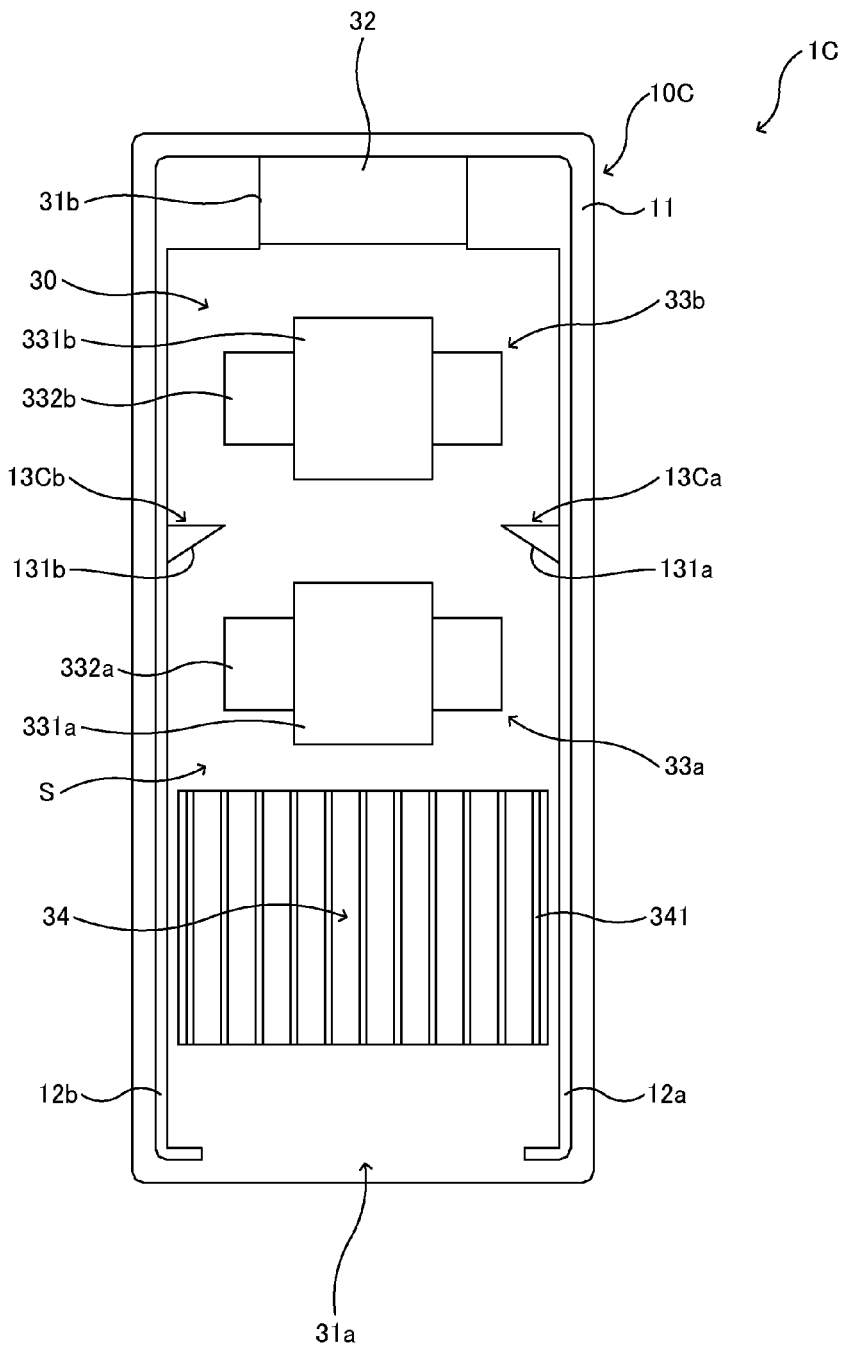
FIG. 9 is a plan view of the power converting apparatus on the air duct side with the air duct cover omitted according to a modification in which protrusions each have a tapered surface on the upwind side.

The protrusions may have tapered surfaces on the upwind side. Referring to FIG. 9, which illustrates a power converting apparatus 1C according to this modification, a housing 10C includes the above-described housing base 11, the above-described air duct walls 12a and 12b, and two protrusions 13Ca and 13Cb. The protrusions 13Ca and 13Cb are each in the form of an approximately right-angled triangle in plan view on the air duct 30 side (the front side of the paper surface of FIG. 9) of the housing base 11.

Similarly to the protrusions 13a and 13b, the protrusions 13Ca and 13Cb are molded integrally with the housing base 11 and the air duct walls 12a and 12b. The protrusions 13Ca and 13Cb are disposed in opposing arrangement between the first reactor 33a and the second reactor 33b. Specifically, the protrusion 13Ca protrudes from the inner wall of the air duct wall 12a toward the center portion of the air-flowing space S. The protrusion 13Cb protrudes from the inner wall of the air duct wall 12b toward the center portion of the air-flowing space S. The protrusions 13Ca and 13Cb protrude by a distance approximately corresponding to the distance between the outer peripheral position of the coil 332b of the second reactor 33b and the air duct wall 12a or 12b while gradually reducing each thickness in the direction toward the center portion of the air-flowing space S. That is, the protrusion 13Ca has a tapered surface 131a on the upwind side (the lower side in FIG. 9) to form the hypotenuse of a triangle in plan view on the air duct 30 side of the housing base 11. The protrusion 13Cb has a tapered surface 131b on the upwind side to form the hypotenuse of a triangle in plan view on the air duct 30 side of the housing base 11.

The power converting apparatus 1C is otherwise similar to the power converting apparatus 1 according to the above embodiment.

With this modification, the tapered surfaces 131a and 131b respectively on the protrusions 13Ca and 13Cb on the upwind side ensure a smooth flow of the cooling air at the position where the protrusions 13Ca and 13Cb are disposed, which is between the first reactor 33a and the second reactor 33b. This results in reduced resistance in the air duct 30.

(4) Second Example of Upwind Tapered Surfaces on the Protrusions

Figure 10:
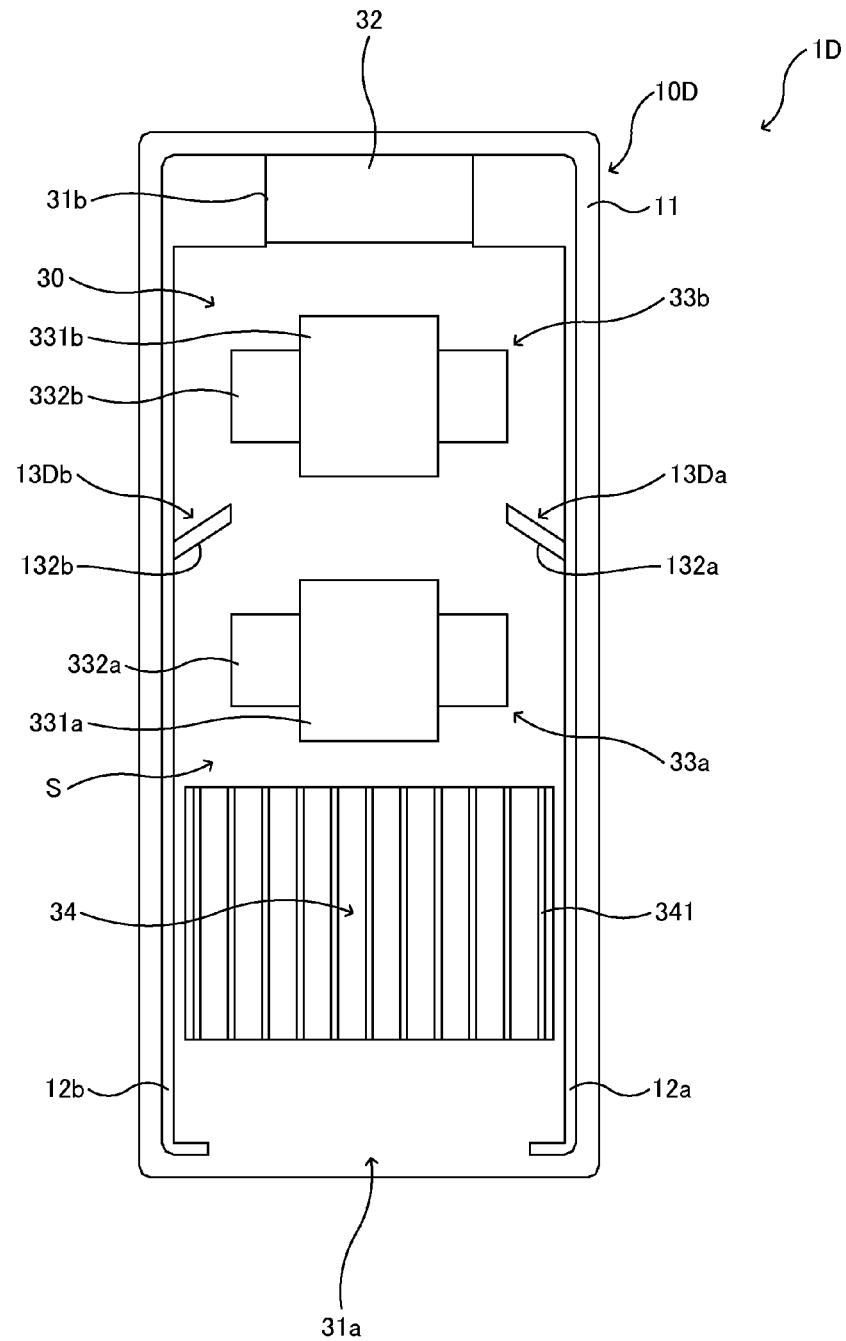
FIG. 10 is a plan view of the power converting apparatus on the air duct side with the air duct cover omitted according to a modification in which protrusions each have a tapered surface on the upwind side.

Referring to FIG. 10, which illustrates a power converting apparatus 1D according to this modification, a housing 10D includes the above-described housing base 11, the above-described air duct walls 12a and 12b, and two protrusions 13Da and 13Db. The protrusions 13Da and 13Db are each in the form of a plate skewed toward the downwind side (toward the upper side in FIG. 10).

Similarly to the protrusions 13a and 13b, the protrusions 13Da and 13Db are molded integrally with the housing base 11 and the air duct walls 12a and 12b. The protrusions 13Da and 13Db are disposed in opposing arrangement between the first reactor 33a and second reactor 33b. Specifically, the protrusion 13Da protrudes from the inner wall of the air duct wall 12a toward a downwind center portion of the air-flowing space S. The protrusion 13Db protrudes from the inner wall of the air duct wall 12b toward the downwind center portion of the air-flowing space S. The protrusions 13Da and 13Db protrude by a distance approximately corresponding to the distance between the outer peripheral position of the coil 332b of the second reactor 33b and the air duct wall 12a or 12b. That is, the protrusion 13Da has a tapered surface 132a on the upwind side (the lower side in FIG. 10), and the protrusion 13Db has a tapered surface 132b on the upwind side.

The power converting apparatus 1D is otherwise similar to the power converting apparatus 1 according to the above embodiment.

This modification provides similar advantageous effects to those in modification (3).

(5) The Protrusions have Cable Pass-through Notches

Figure 11:
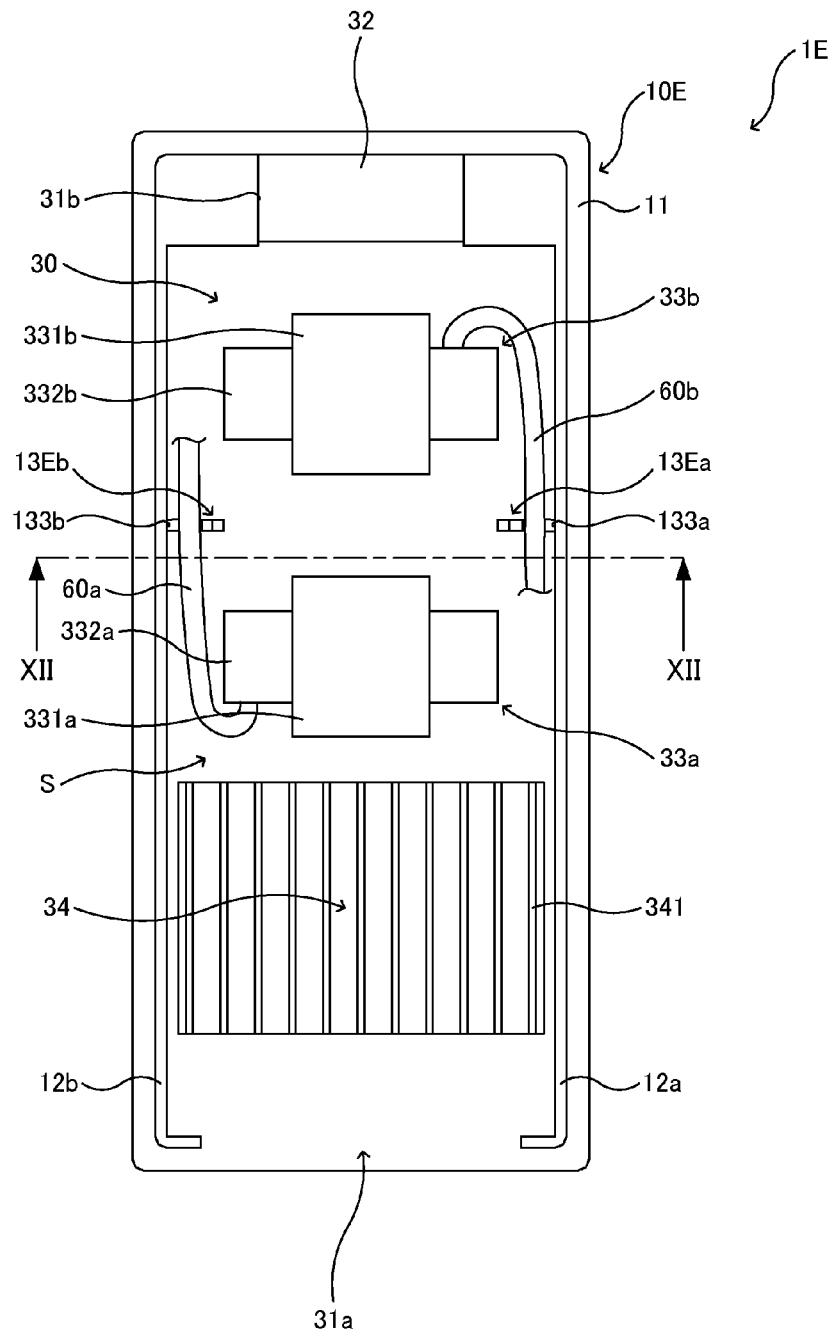
FIG. 11 is a plan view of the power converting apparatus on the air duct side with the air duct cover omitted according to a modification in which protrusions each have a cable pass-through notch.
Figure 12A:
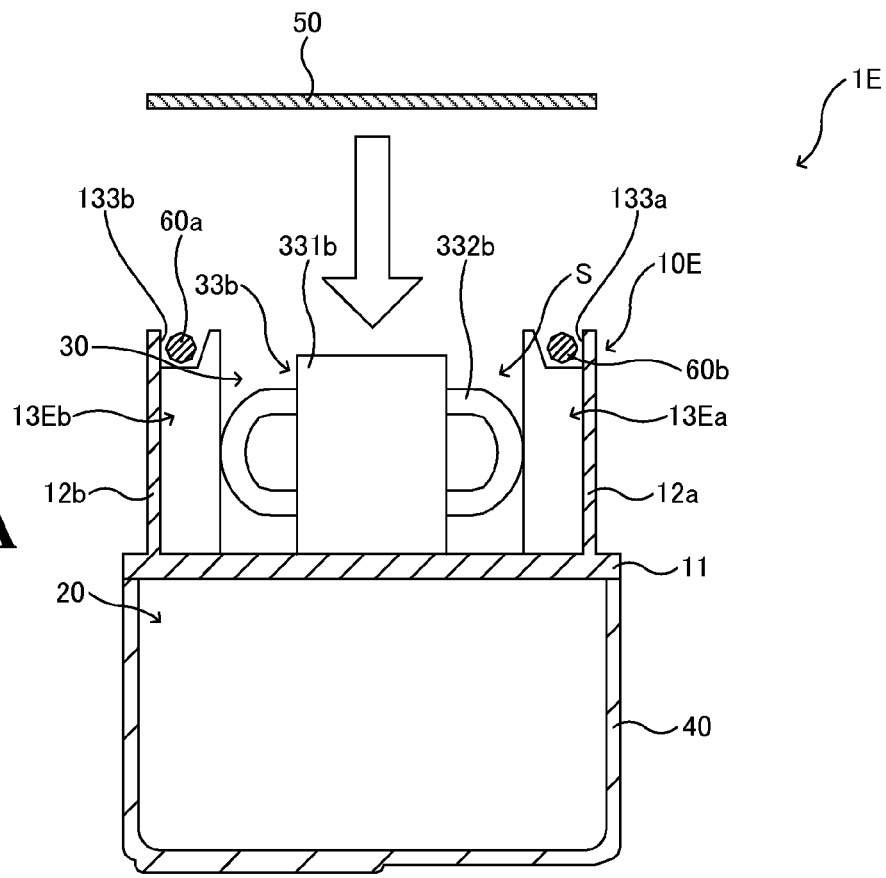
FIGS. 12A and 12B are cross-sectional views of the power converting apparatus taken along the line XII-XII of FIG. 11.
Figure 12B:
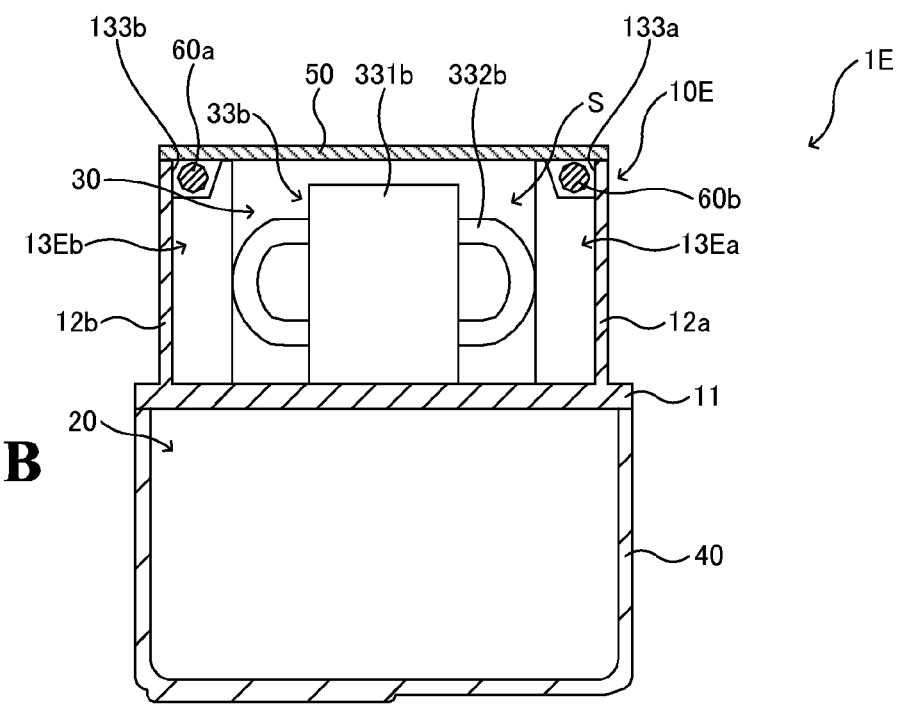

The protrusions each may have a cable pass-through notch. Referring to FIG. 11, FIG. 12A, and FIG. 12B, a power converting apparatus according to this modification will be described. FIG. 12A illustrates a state before the air duct cover 50 is attached to the housing, while FIG. 12B illustrates a state after the air duct cover 50 is attached to the housing.

Referring to FIG. 11, FIG. 12A, and FIG. 12B, which illustrate a power converting apparatus 1E according to this modification, a housing 10E includes the above-described housing base 11, the above-described air duct walls 12a and 12b, and two plate-shaped protrusions 13Ea and 13Eb. In the air duct 30, cables 60a and 60b are respectively wired to the first reactor 33a and the second reactor 33b.

Similarly to the protrusions 13a and 13b, the protrusions 13Ea and 13Eb are molded integrally with the housing base 11 and the air duct walls 12a and 12b. The protrusions 13Ea and 13Eb are disposed in opposing arrangement between the first reactor 33a and the second reactor 33b. Specifically, the protrusion 13Ea protrudes from the inner wall of the air duct wall 12a toward the center portion of the air-flowing space S. The protrusion 13Eb protrudes from the inner wall of the air duct wall 12b toward the center portion of the air-flowing space S. The protrusions 13Ea and 13Eb protrude by a distance approximately corresponding to the distance between the outer peripheral position of the coil 332b of the second reactor 33b and the air duct wall 12a or 12b. The protrusion 13Ea has a cable pass-through notch 133a. The notch 133a is disposed at the end portion of the protrusion 13Ea on the side opposite the housing base 11 (on the front side of the paper surface of FIG. 11, and the upper side in FIGS. 12A and 12B), and on the side of the air duct wall 12a (on the right side in FIG. 11 and FIGS. 12A and 12B). The protrusion 13Eb has a cable pass-through notch 133b. The notch 133b is disposed at the end portion of the protrusion 13Eb on the side opposite the housing base 11, and on the side of the air duct wall 12b (on the left side in FIG. 11 and FIGS. 12A and 12B). It is noted that the protrusion 13Ea may have a notch at an approximately center position in the widthwise direction (the right-to-left direction in FIG. 11 and FIGS. 12A and 12B) at the end portion on the side opposite the housing base 11, and that the protrusion 13Eb may have a notch at an approximately center position in the widthwise direction (the right-to-left direction in FIG. 11 and FIGS. 12A and 12B) at the end portion on the side opposite the housing base 11.

The cable 60a wired in the air duct 30 is passed through the notch 133b of the protrusion 13Eb and secured between the protrusion 13Eb and the air duct cover 50. The cable 60b wired in the air duct 30 is passed through the notch 133a of the protrusion 13Ea and secured between the protrusion 13Ea and the air duct cover 50.

The power converting apparatus 1E is otherwise similar to the power converting apparatus 1 according to the above embodiment.

This modification provides advantageous effects described below. The cables 60a and 60b, which are respectively coupled to the reactors 33a and 33b, are wired in the air duct 30 usually in an un-secured state. This creates a possibility of wobbling and rocking of the cables 60a and 60b in the air duct 30. In this modification, the protrusions 13Ea and 13Eb individually have the cable pass-through notches 133a and 133b, respectively. This ensures that the cables 60a and 60b are secured between the protrusions 13Ea and 13Eb and the air duct cover 50. This minimizes wobbling and rocking of the cables 60a and 60b. Additionally, the protrusions 13Ea and 13Eb respectively have the notches 133a and 133b respectively on the sides of the air duct walls 12a and 12b. This ensures that the cables 60a and 60b are secured in close proximity to the sides of the air duct walls 12a and 12b, respectively. This keeps the cables 60a and 60b at a distance from the reactors 33a and 33b, thereby protecting the cables 60a and 60b from the heat of the reactors 33a and 33b.

(6) The Protrusions are Disposed on the air Duct Cover Side

Figure 13A:
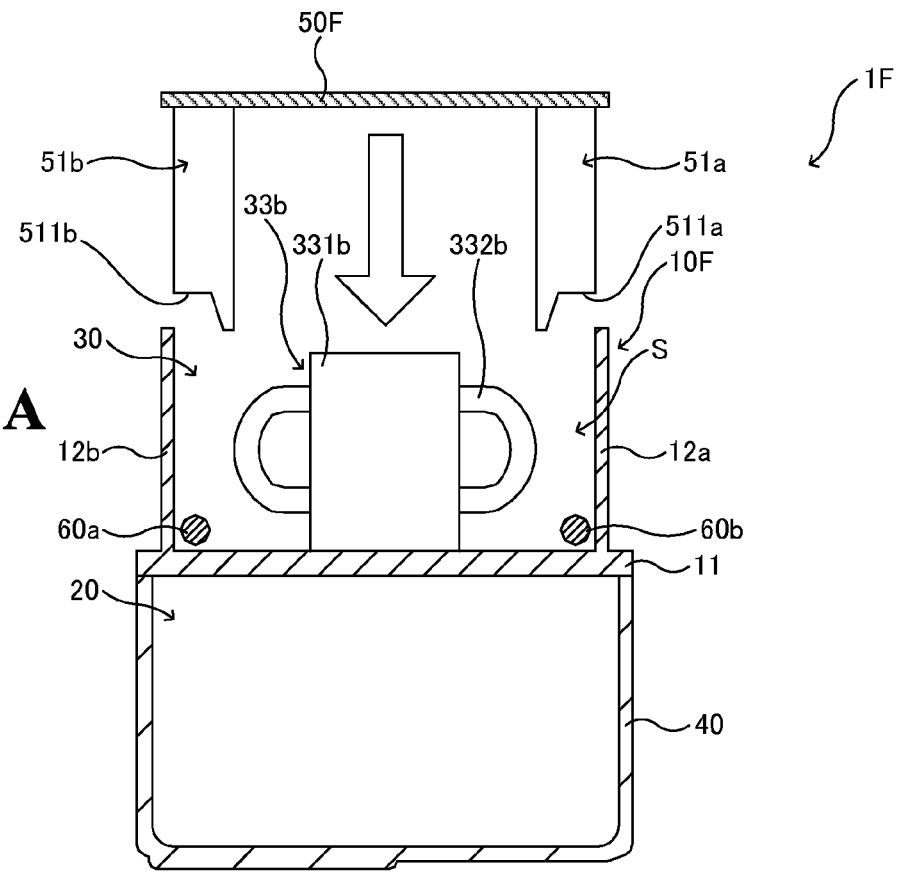
FIGS. 13A and 13B are cross-sectional views of the power converting apparatus according to a modification in which protrusions are disposed on the side of the air duct cover.
Figure 13B:
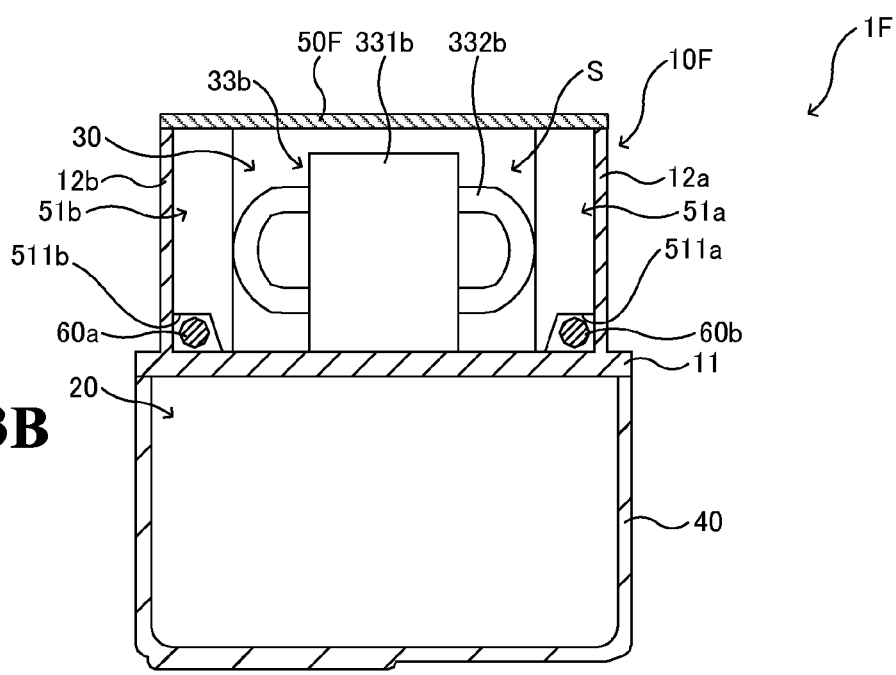

While in the above embodiment the protrusions 13a and 13b are disposed on side of the housing 10, this should not be construed in a limiting sense. The protrusions may be disposed on the side of the air duct cover. Referring to FIGS. 13A and 13B, a power converting apparatus according to this modification will be described. FIG. 13A illustrates a state before the air duct cover is attached to the housing, while FIG. 13B illustrates a state after the air duct cover is attached to the housing.

Referring to FIG. 13A and FIG. 13B, which illustrate a power converting apparatus 1F according to this modification, a housing 10F includes the above-described housing base 11 and the above-described air duct walls 12a and 12b. That is, the housing 10F corresponds to the housing 10 less the protrusions 13a and 13b. In the air duct 30, the cables 60a and 60b are respectively wired to the first reactor 33a and the second reactor 33b (see FIG. 2 for the first reactor 33a, which is not shown in FIGS. 13A and 13B). A plate-shaped air duct cover 50F is disposed on the air duct walls 12a and 12b on the side opposite the housing base 11 (on the upper side in FIGS. 13A and 13B). The air duct cover 50F covers the air duct 30 on the side opposite the housing base 11. The air duct cover 50F includes two plate-shaped protrusions 51a and 51b on the side of the housing base 11 (on the lower side in FIGS. 13A and 13B). The air duct cover 50F is molded integrally with the protrusions 51a and 51b using resin. Alternatively, the air duct cover 50F may be a separate entity, while the protrusions 51a and 51b may be other separate entities.

With the air duct cover 50F attached to the housing 10F, the protrusions 51a and 51b are disposed in opposing arrangement between the first reactor 33a and the second reactor 33b. Specifically, the protrusion 51a protrudes from the inner wall of the air duct wall 12a toward the center portion of the air-flowing space S. The protrusion 51b protrudes from the inner wall of the air duct wall 12b toward the center portion of an air-flowing space S. The protrusions 51a and 51b protrude by a distance approximately corresponding to the distance between the outer peripheral position of the coil 332b of the second reactor 33b and the air duct wall 12a or 12b. The protrusion 51a has a cable pass-through notch 511a. The notch 511a is disposed at the end portion of the protrusion 51a on the side of the housing base 11 and on the side of the air duct wall 12a (on the right side in FIGS. 13A and 13B). The protrusion 51b has a cable pass-through notch 511b. The notch 511b is disposed at the end portion of the protrusion 51b on the side of the housing base 11 and on the side of the air duct wall 12b (on the left side in FIGS. 13A and 13B).

The cable 60a wired in the air duct 30 is passed through the notch 511b of the protrusion 51b and secured between the protrusion 51b and the housing base 11. The cable 60b wired in the air duct 30 is passed through the notch 511a of the protrusion 51a and secured between the protrusion 51a and the housing base 11.

The power converting apparatus 1F is otherwise similar to the power converting apparatus 1 according to the above embodiment.

With this modification, providing the protrusions 51a and 51b on the air duct cover 50F ensures integral molding of the protrusions 51a and 51b with the air duct cover 50F using resin, provided that the air duct cover 50F is made of resin. This reduces the weight of the power converting apparatus 1F compared with metal protrusions. Additionally, metal protrusions require a predetermined insulation gap between the metal protrusions and the reactors 33a and 33b at the time of arranging the reactors 33a and 33b in the air duct 30. Contrarily, the resin protrusions 51a and 51b eliminate the need for ensuring an insulation gap, resulting in a further improved freedom of arrangement of the protrusions 51a and 51b and of the reactors 33a and 33b. Additionally, the cable pass-through notches 511a and 511b on the protrusions 51a and 51b ensure that the cables 60a and 60b are secured between the protrusions 51a and 51b and the housing base 11. This minimizes wobbling and rocking of the cables 60a and 60b, similarly to modification (5).

(7) The Protrusions are Disposed both on the Housing and the Air Duct Cover

While in the above embodiment the protrusions 13a and 13b are disposed on the housing 10, this should not be construed in a limiting sense. The protrusions may be disposed both on the housing and the air duct cover. Referring to FIGS. 14A and 14B, a power converting apparatus according to this modification will be described. FIG. 14A illustrates a state before the air duct cover is attached to the housing, while FIG. 14B illustrates a state after the air duct cover is attached to the housing.

Referring to FIG. 14A and FIG. 14B, which illustrate a power converting apparatus 1G according to this modification, a housing 10G includes the above-described housing base 11, the above-described air duct walls 12a and 12b, and two first protrusion pieces 13Ga and 13Gb each in the form of a short plate. In the air duct 30, the cables 60a and 60b are respectively wired to the first reactor 33a and the second reactor 33b (see FIG. 2 for the first reactor 33a, which is not shown in FIGS. 14A and 14B).

Similarly to the protrusions 13a and 13b, the first protrusion pieces 13Ga and 13GB are molded integrally with the housing base 11 and the air duct walls 12a and 12b. The first protrusion pieces 13Ga and 13Gb are disposed in opposing arrangement between the first reactor 33a and the second reactor 33b. Specifically, the first protrusion piece 13Ga protrudes from the inner wall of the air duct wall 12a on the side of the housing base 11 (on the lower side in FIGS. 14A and 14B) toward the center portion of the air-flowing space S. The first protrusion piece 13Gb protrudes from the inner wall of the air duct wall 12b on the side of the housing base 11 toward the center portion of the air-flowing space S. The first protrusion pieces 13Ga and 13Gb protrude by a distance approximately corresponding to the distance between the outer peripheral position of the coil 332b of the second reactor 33b and the air duct wall 12a or 12b. The first protrusion piece 13Ga has a first notch 133Ga at the end portion of the first protrusion piece 13Ga on the side opposite the housing base 11 (on the upper side in FIGS. 14A and 14B), and on the side of the air duct wall 12a (on the right side in FIGS. 14A and 14B). The first protrusion piece 13Gb has a first notch 133Gb at the end portion of the first protrusion piece 13Gb on the side opposite the housing base 11 and on the side of the air duct wall 12b (on the left side in FIGS. 14A and 14B).

A plate-shaped air duct cover 50G is disposed on the air duct walls 12a and 12b on the side opposite the housing base 11. The air duct cover 50G covers the air duct 30 on the side opposite the housing base 11. The air duct cover 50G includes, on the side of the housing base 11, two second protrusion pieces 51Ga and 51Gb each in the form of a short plate. The air duct cover 50G is integrally molded with the second protrusion pieces 51Ga and 51Gb using resin. Alternatively, the air duct cover 50G may be a separate entity, while the second protrusion pieces 51Ga and 51Gb may be other separate entities.

The second protrusion pieces 51Ga and 51Gb approximately correspond to the first protrusion pieces 13Ga and 13Gb, respectively, when the air duct cover 50G is attached to the housing 10G. Specifically, with the air duct cover 50G attached to the housing 10G, the second protrusion pieces 51Ga and 51Gb are disposed in opposing arrangement between the first reactor 33a and the second reactor 33b. More specifically, the second protrusion piece 51Ga protrudes from the inner wall of the air duct wall 12a on the side opposite the housing base 11 toward the center portion of the air-flowing space S. The second protrusion piece 51Gb protrudes from the inner wall of the air duct wall 12b on the side opposite the housing base 11 toward the center portion of the air-flowing space S. The second protrusion pieces 51Ga and 51Gb protrude by a distance approximately corresponding to the distance between the outer peripheral position of the coil 332b of the second reactor 33b and the air duct wall 12a or 12b. The second protrusion piece 51Ga has a second notch 511Ga at the end portion of the second protrusion piece 51Ga on the side of the housing base 11 and on the side of the air duct wall 12a. The second protrusion piece 51Gb has a second notch 511Gb at the end portion of the second protrusion piece 51Gb on the side of the housing base 11 and on the side of the air duct wall 12b.

In this modification, the first protrusion piece 13Ga on the housing 10G and the second protrusion piece 51Ga on the air duct cover 50G cooperate to form a protrusion, while the first protrusion piece 13Gb on the housing 10G and the second protrusion piece 51Gb on the air duct cover 50G cooperate to form another protrusion. Also in this modification, the first notch 133Ga of the first protrusion piece 13Ga and the second notch 511Ga of the second protrusion piece 51Ga cooperate to form a cable pass-through notch, while the first notch 133Gb of the first protrusion piece 13Gb and the second notch 511Gb of the second protrusion piece 51Gb cooperate to form another cable pass-through notch.

That is, in this modification, the cable 60a wired in the air duct 30 is passed through the notch formed by the first notch 133Gb of the first protrusion piece 13Gb and the second notch 511Gb of the second protrusion piece 51Gb, and secured between the first protrusion piece 13Gb and the second protrusion piece 51Gb. The cable 60b wired in the air duct 30 is passed through the notch formed by the first notch 133Ga of the first protrusion piece 13Ga and the second notch 511Ga of the second protrusion piece 51Ga, and secured between the first protrusion piece 13Ga and the second protrusion piece 51Ga.

The power converting apparatus 1G is otherwise similar to the power converting apparatus 1 according to the above embodiment.

With this modification, the first protrusion pieces 13Ga and 13Gb disposed on the housing 10G and the second protrusion pieces 51Ga and 51Gb disposed on the air duct cover 50G cooperate to form the protrusions. This ensures provision of the cable pass-through notch at a location along the height of the protrusion or other locations that would be difficult to realize in the case of integrally molding the protrusion with either the housing or the air duct cover. Additionally, the first notches 133Ga and 133Gb of the first protrusion pieces 13Ga and 13Gb respectively cooperate with the second notches 511Ga and 511Gb of the second protrusion pieces 51Ga and 51Gb to form the cable pass-through notches. This ensures that the cables 60a and 60b are respectively secured between the first protrusion pieces 13Ga and 13Gb and the second protrusion piece 51Ga and 51Gb. This minimizes wobbling and rocking of the cables 60a and 60b, similarly to modification (5).

(8) Two Protrusions are Disposed in Staggered Arrangement

In the above embodiment, the protrusions 13a and 13b are disposed in opposing arrangement such that the protrusions 13a and 13b respectively protrude from the air duct walls 12a and 12b toward the center portion of the air-flowing space S. This, however, should not be construed in a limiting sense. The two protrusions may be disposed such that the distance between one of the protrusions and the first reactor 33a is approximately equal to the distance between the other protrusion and the second reactor 33b.

Figure 15:
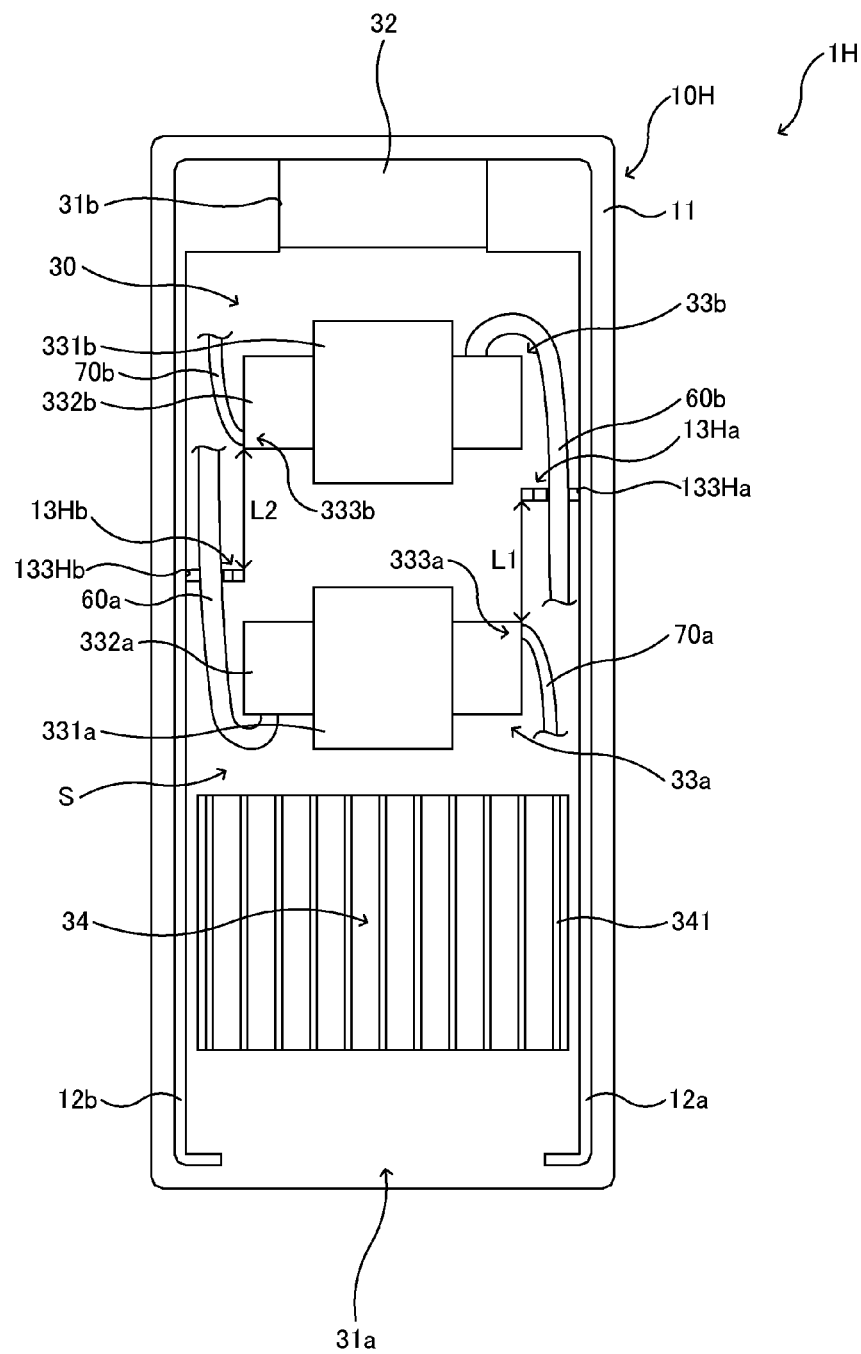
FIG. 15 is a plan view of the power converting apparatus on the air duct side with the air duct cover omitted according to a modification in which two protrusions are disposed in staggered arrangement.

Referring to FIG. 15, which illustrates a power converting apparatus 1H according to this modification, a housing 10H includes the above-described housing base 11, the above-described air duct walls 12a and 12b, and two plate-shaped protrusions 13Ha and 13Hb. In the air duct 30, cables 60a and 70a are wired to the first reactor 33a, while cables 60b and 70b are wired to the second reactor 33b.

Similarly to the protrusions 13a and 13b, the protrusions 13Ha and 13Hb are molded integrally with the housing base 11 and the air duct walls 12a and 12b. Between the first reactor 33a and the second reactor 33b, the protrusion 13Ha protrudes from the inner wall of the air duct wall 12a toward the center portion of an air-flowing space S, while the protrusion 13Hb protrudes from the inner wall of the air duct wall 12b toward the center portion of an air-flowing space S. The protrusions 13Ha and 13Hb protrude by a distance approximately corresponding to the distance between the outer peripheral position of the coil 332b of the second reactor 33b and the air duct wall 12a or 12b. More specifically, the protrusions 13Ha and 13Hb are disposed with a distance L1 and a distance L2 approximately equal to one another. The distance L1 is between the protrusion 13Ha (one of the protrusions) and the first reactor 33a (specifically, a wire coupling portion 333a between the first reactor 33a and the cable 70a), and the distance L2 is between the protrusion 13Hb (the other protrusion) and the second reactor 33b (specifically, a wire coupling portion 333b between the second reactor 33b and the cable 70b). The protrusion 13Ha has a cable pass-through notch 133Ha at the end portion of the protrusion 13Ha on the side opposite the housing base 11 (on the front side of the paper surface of FIG. 15), and on the side of the air duct wall 12a (on the right side in FIG. 15). The protrusion 13Hb has a cable pass-through notch 133Hb at the end portion of the protrusion 13Ha on the side opposite the housing base 11 and on the side of the air duct wall 12b (on the left side in FIG. 15).

The cable 60a wired in the air duct 30 is passed through the notch 133Hb of the protrusion 13Hb and secured between the protrusion 13Hb and the air duct cover 50 (not shown in FIG. 15). The cable 60b wired in the air duct 30 is passed through the notch 133Ha of the protrusion 13Ha and secured between the protrusion 13Ha and the air duct cover 50.

The power converting apparatus 1H is otherwise similar to the power converting apparatus 1 according to the above embodiment.

With this modification, the protrusions 13Ha and 13Hb respectively protrude from the inner walls of the air duct walls 12a and 12b toward the center portion of the air-flowing space S. The protrusions 13Ha and 13Hb are disposed with the distance L1 between the protrusion 13Ha and the wire coupling portion 333a approximately equal to the distance L2 between the protrusion 13Hb and the wire coupling portion 333b. This addresses to the situation where parts of the reactors 33a and 33b need an insulation gap from the housing 10H, examples of the parts including the wire coupling portions 333a and 333b associated with the cables 70a and 70b, and the parts are positioned to one side in the width direction of the reactors 33a and 33b. Specifically, the situation is addressed by arranging the protrusions 13Ha and 13Hb in accordance with the positions of the parts of the reactors 33a and 33b while ensuring an insulation gap between the protrusions 13Ha and 13Hb and the parts of the reactors 33a and 33b.

(9) The Protrusions as Separate from the Housing

While in the above embodiment the protrusions 13a and 13b are molded integrally with the housing base 11 and the air duct walls 12a and 12b, this should not be construed in a limiting sense. The protrusions may be separate from the housing base 11 and the air duct walls 12a and 12b. In this case, the protrusions may be disposed on the housing base 11 or on the air duct walls 12a and 12b. Alternatively, the protrusions may be disposed on the air duct cover 50. These cases provide similar advantageous effects to those in the above embodiment.

(10) Three or More Reactors Arranged in Series in the Air Duct

While in the above embodiment the two reactors 33a and 33b are arranged in series in the direction from the upwind side to the downwind side in the air duct 30, this should not be construed in a limiting sense. Three or more reactors may be arranged in series in the direction from the upwind side to the downwind side in the air duct 30. In this case, the protrusions may be disposed between adjacent two reactors among the three or more reactors; specifically, between a upwind reactor (first heat generator, heat generator) and a downwind reactor (second heat generator, heat generator). This provides similar advantageous effects to those in the above embodiment.

(11) A Single Reactor Arranged in the Air Duct

A single reactor may be disposed in the air duct. In this case, the single reactor is disposed in series with the plurality of fins 341 of the heat sink 34 in the air duct 30, with the plurality of fins 341 on the upwind side and the single reactor on the upwind side. The protrusions may be disposed between the plurality of fins 341 (first heat generator, heat generator) and the adjacent single reactor (second heat generator, heat generator). This provides similar advantageous effects to those in the above embodiment.

(12) The Reactors Arranged Laterally

While in the above embodiment the reactors 33a and 33b are disposed with the coils 332a and 332b each having an axial direction oriented in the direction from the upwind side to the downwind side in the air duct 30, this should not be construed in a limiting sense. The reactors 33a and 33b may be disposed with the coils 332a and 332b each having an axial direction oriented in the direction orthogonal to the direction from the upwind side to the downwind side, that is, oriented in the direction from the air duct wall 12a to the air duct wall 12b.

(13) The Fan Arranged on the Upwind Side

While in the above embodiment the fan 32 is disposed on the downwind side, this should not be construed in a limiting sense. The fan may be disposed on the upwind side. This provides similar advantageous effects to those in the above embodiment.

(14) Other Remarks

While in the above embodiment the inverter to convert direct current power into alternating current power is described as an exemplary power converting apparatus, this should not be construed in a limiting sense. The present invention also finds applications in converters to convert alternating current power into direct current power.

It will be appreciated that various embodiments and modifications described herein may be readily combined.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A power converting apparatus configured to convert alternating current power into direct current power or convert direct current power into alternating current power, the power converting apparatus comprising:
 a housing base having a first surface and a second surface;
 a main body on the first surface of the housing base;
 an air duct through which cooling air flows on the second surface of the housing base;
 a pair of upright air duct walls on the second surface of the housing base, the pair of air duct walls extending in a direction from an upwind side to a downwind side;
 a first heat generator and a second heat generator disposed on the second surface of the housing base in series in the direction from the upwind side to the downwind side in the air duct with the first heat generator on the upwind side and the second heat generator on the downwind side; and
 at least one protrusion between the first heat generator and the second heat generator to protrude from at least one of the pair of air duct walls toward a center portion of an air-flowing space for the cooling air,
 wherein the at least one protrusion is a protrusion wall that protrudes in a fixed relationship from the at least one of the pair of air duct walls towards the center portion of the air-flowing space along a plane that is substantially perpendicular to the direction from the upwind side to the downwind side.

2. The power converting apparatus according to claim 1, wherein the at least one protrusion is disposed on at least one of the housing base or the at least one pair of air duct walls.

3. The power converting apparatus according to claim 2, wherein the at least one protrusion comprises a cable pass-through notch.

4. The power converting apparatus according to claim 3, wherein the notch faces a side of the at least one of the pair of air duct walls.

5. The power converting apparatus according to claim 1, further comprising an air duct cover over the air duct and opposite the housing base across the air duct,
wherein the at least one protrusion is disposed on the air duct cover.

6. The power converting apparatus according to claim 5, wherein the at least one protrusion comprises a cable pass-through notch.

7. The power converting apparatus according to claim 6, wherein the notch faces a side of the at least one of the pair of air duct walls.

8. The power converting apparatus according to claim 1, further comprising an air duct cover over the air duct and opposite the housing base across the air duct,
wherein the at least one protrusion comprises:
a first protrusion piece disposed on at least one of the housing base or the at least one pair of air duct walls; and
a second protrusion piece disposed on the air duct cover.

9. The power converting apparatus according to claim 8, wherein the at least one protrusion comprises a cable pass-through notch.

10. The power converting apparatus according to claim 9, wherein the notch faces a side of the at least one of the pair of air duct walls.

11. The power converting apparatus according to claim 1, wherein the at least one protrusion comprises a cable pass-through notch.

12. The power converting apparatus according to claim 11, wherein the notch faces a side of the at least one of the pair of air duct walls.

13. The power converting apparatus according to claim 1, wherein the first heat generator comprises a first reactor while the second heat generator comprises a second reactor, the first reactor and the second reactor each comprising a core and a coil, the coil having an axial direction oriented in the direction from the upwind side to the downwind side in the air duct.

14. The power converting apparatus according to claim 13, wherein the at least one protrusion protrudes from the at least one of the pair of air duct walls toward the center portion of the air-flowing space by a distance approximately corresponding to a distance between an outer peripheral position of the coil of the second reactor and the at least one of the pair of air duct walls.

15. The power converting apparatus according to claim 13, wherein the at least one protrusion protrudes from the at least one of the pair of air duct walls toward the center portion of the air-flowing space by a distance approximately corresponding to a distance between an inner peripheral position of the coil of the second reactor and the at least one of the pair of air duct walls.

16. The power converting apparatus according to claim 1, wherein the at least one protrusion has a tapered surface on the upwind side.

17. The power converting apparatus according to claim 1, wherein the at least one protrusion comprises a first protrusion and a second protrusion, the first protrusion protruding from the at least one of the pair of air duct walls toward the center portion of the air-flowing space of the cooling air while the second protrusion protruding from another one of the pair of air duct walls toward the center portion of the air-flowing space of the cooling air, and
wherein a distance between the first protrusion and the first heat generator is approximately equal to a distance between the second protrusion and the second heat generator.

18. A power converting apparatus configured to convert alternating current power into direct current power or convert direct current power into alternating current power, the power converting apparatus comprising:
a housing base having a first surface and a second surface;
a main body on the first surface of the housing base;
an air duct through which cooling air flows on the second surface of the housing base;
a pair of upright air duct walls on the second surface of the housing base, the pair of air duct walls extending in a direction from an upwind side to a downwind side;
a first heat generator and a second heat generator disposed in series in the direction from the upwind side to the downwind side in the air duct with the first heat generator on the upwind side and the second heat generator on the downwind side;
a heat sink made of heat conducting material and provided on the second surface of the housing base, the heat sink being provided in series in the direction from the upwind side to the downwind side in the air duct with the first heat generator and the second heat generator, and the heat sink being on the upwind side of the first heat generator; and
at least one protrusion between the first heat generator and the second heat generator to protrude from at least one of the pair of air duct walls toward a center portion of an air-flowing space for the cooling air.

19. A power converting apparatus configured to convert alternating current power into direct current power or convert direct current power into alternating current power, the power converting apparatus comprising:
a housing base having a first surface and a second surface;
a main body on the first surface of the housing base;
an air duct through which cooling air flows on the second surface of the housing base;
a pair of upright air duct walls on the second surface of the housing base, the pair of air duct walls extending in a direction from an upwind side to a downwind side;
a first heat generator and a second heat generator disposed in series in the direction from the upwind side to the downwind side in the air duct with the first heat generator on the upwind side and the second heat generator on the downwind side; and
at least one protrusion between the first heat generator and the second heat generator to protrude from at least one of the pair of air duct walls toward a center portion of an air-flowing space for the cooling air,
wherein the first heat generator comprises a first reactor comprising a core and a coil wound around the core about an axis, the axis of the coil having an axial direction oriented in the direction from the upwind side to the downwind side in the air duct.

* * * * *